(12) United States Patent
Johnson

(10) Patent No.: US 7,741,566 B2
(45) Date of Patent: Jun. 22, 2010

(54) MICROELECTRONIC SUBSTRATES WITH THERMALLY CONDUCTIVE PATHWAYS AND METHODS OF MAKING SAME

(75) Inventor: Benny H. Johnson, Aloha, OR (US)

(73) Assignee: Merix Corporation

( * ) Notice: Subject to any disclaimer, the term of this patent is extended or adjusted under 35 U.S.C. 154(b) by 869 days.

(21) Appl. No.: 10/555,899

(22) PCT Filed: May 7, 2004

(86) PCT No.: PCT/US2004/014209

§ 371 (c)(1),
(2), (4) Date: Dec. 4, 2006

(87) PCT Pub. No.: WO2004/103038

PCT Pub. Date: Nov. 25, 2004

(65) Prior Publication Data

US 2007/0272435 A1 Nov. 29, 2007

Related U.S. Application Data

(60) Provisional application No. 60/468,801, filed on May 7, 2003.

(51) Int. Cl.
*H05K 1/11* (2006.01)
(52) U.S. Cl. .................. 174/262; 174/252; 361/704; 361/707; 361/718; 257/706; 257/713
(58) Field of Classification Search ............ 174/262, 174/252; 361/704, 707, 719; 257/699–714
See application file for complete search history.

(56) References Cited

U.S. PATENT DOCUMENTS

| 4,509,096 A * | 4/1985 | Baldwin et al. ............. 361/719 |
| 5,459,639 A * | 10/1995 | Izumi ......................... 361/707 |
| 5,562,971 A * | 10/1996 | Tsuru et al. ................. 428/209 |
| 5,625,227 A * | 4/1997 | Estes et al. .................. 257/712 |
| 5,637,832 A * | 6/1997 | Danner ....................... 174/260 |
| 5,652,463 A * | 7/1997 | Weber et al. ................ 257/706 |
| 5,779,134 A * | 7/1998 | Watson et al. ............. 228/179.1 |
| 6,032,355 A * | 3/2000 | Tseng et al. .................. 29/840 |
| 6,078,101 A * | 6/2000 | Aizenberg et al. .......... 257/699 |
| 6,181,561 B1 * | 1/2001 | Albrecht et al. ............. 361/719 |
| 6,188,579 B1 * | 2/2001 | Buondelmonte et al. .... 361/719 |
| 6,190,941 B1 | 2/2001 | Heinz et al. |
| 6,200,407 B1 * | 3/2001 | Wieloch et al. ............. 156/252 |
| 6,411,516 B1 * | 6/2002 | Palumbo et al. ............. 361/704 |

* cited by examiner

*Primary Examiner*—Tuan T Dinh
*Assistant Examiner*—Xiaoliang Chen
(74) *Attorney, Agent, or Firm*—Gallop, Johnson & Neuman, L.C.

(57) ABSTRACT

This disclosure suggests microelectronic substrates with thermally conductive pathways. In one implementation, such a substrate includes a body and a thermally conductive member. The Body has a first surface that includes a microelectronic component mounting site, a second surface separated from the first surface by a thickness, and an opening extending through at least a portion of the thickness. The opening is outwardly open at one or both of the surfaces and has a first portion having a first transverse dimension and a second portion having a larger second transverse dimension. The thermally conductive member includes a first thickness, which is received in the first portion of the opening, and a second thickness, which is received in the second portion of the opening. A transverse dimension of the second thickness of the thermally conductive member is greater than the first transverse dimension of the opening.

4 Claims, 4 Drawing Sheets

MICROELECTRONIC SUBSTRATES WITH THERMALLY CONDUCTIVE PATHWAYS AND METHODS OF MAKING SAME

REFERENCE TO RELATED APPLICATIONS

This application is a U.S. National Phase application of PCT/US2004/014209, filed May 7, 2004, which claims the benefit of U.S. Provisional Application No. 60/468,801, filed 7 May 2003 and entitled "LAMINATED THERMAL MANAGEMENT COIN/SLUG FOR PRINTED CIRCUIT BOARDS," the entireties of which are incorporated herein by reference.

TECHNICAL FIELD

This invention generally relates to microelectronic substrates, e.g., printed circuit boards (PCBs) or the like. Aspects of the invention are adapted to provide a thermally conductive pathway through the substrate to help dissipate heat.

BACKGROUND

Microelectronic components generate heat in use and can be damaged if they exceed acceptable operating temperatures. As high-energy microelectronic components become more prevalent and powerful, the thermal load produced by these components becomes increasingly difficult to dissipate from the system.

Microelectronic components are commonly attached to a substrate such as a printed circuit board (PCB) to form a larger microelectronic component assembly. A single microelectronic component assembly will often have numerous microelectronic components, each of which generates heat in use, mounted on a single PCB. Dissipation of heat from the side of the PCB bearing the microelectronic components has been and continues to be a significant problem for PCB designers.

A variety of approaches are used in the art to dissipate heat generated by microelectronic components. One solution employs surface-mounted thermal risers with prongs or fins to dissipate heat to the air adjacent the PCB. Other approaches use arrays of copper plated holes (vias) that conduct the thermal load through the PCB and thence to a thermal mass, e.g., a chassis or housing for the microelectronic component assembly or a secondary heat sink on the back side of the finished assembly. One of the most effective thermal management devices is the use of a metal coin or slug to conduct the thermal load through the circuit board to such a thermal mass. After the PCB is formed, e.g., by laminating multiple layers together, a through-opening or cavity may be machined through the thickness of the PCB, forming a passage between the component side and the back side of the PCB. Coins or slugs are then mounted in the opening or cavity using thermal grease or solder, typically as part of the component assembly process during which microelectronic components are mounted on the PCB.

The following patents, the entirety of each of which is incorporated herein by reference, generally relate to PCB thermal management features:

U.S. Pat. No. 5,779,134—Method for surface mounting a heat sink to a printed circuit board U.S. Pat. No. 6,411,516—Copper slug pedestal for a printed circuit board U.S. Pat. No. 6,190,941—Method of fabricating a circuit arrangement with thermal vias U.S. Pat. No. 6,200,407—Method of making a multilayer circuit board having a window exposing an enhanced conductive layer for use as an insulated mounting area.

DETAILED DESCRIPTION

A. Overview

Various embodiments of the present invention provide microelectronic component assemblies and methods of manufacturing microelectronic component assemblies. The term "microelectronic component" may encompass a variety of articles of manufacture, including memory modules (e.g., SIMM, DIMM, DRAM, flash-memory), ASICs, processors, semiconductor wafers, semiconductor dies singulated from such wafers, or any of a variety of other types of microelectronic devices or components therefor. As used herein, "microelectronic component assembly" refers to at least one microelectronic component operatively coupled to a microelectronic component substrate and may include any number of microelectronic components or other structures, e.g., fin-bearing heat sinks. The more general term "microelectronic component" encompasses within its scope microelectronic component assemblies.

For ease of understanding, the following discussion is broken down into two areas of emphasis. The first section describes aspects of microelectronic component assemblies in certain embodiments of the invention. The second section outlines methods of manufacturing microelectronic component assemblies in accordance with other embodiments of the invention.

B. Microelectronic Component Assemblies

Figure 1:
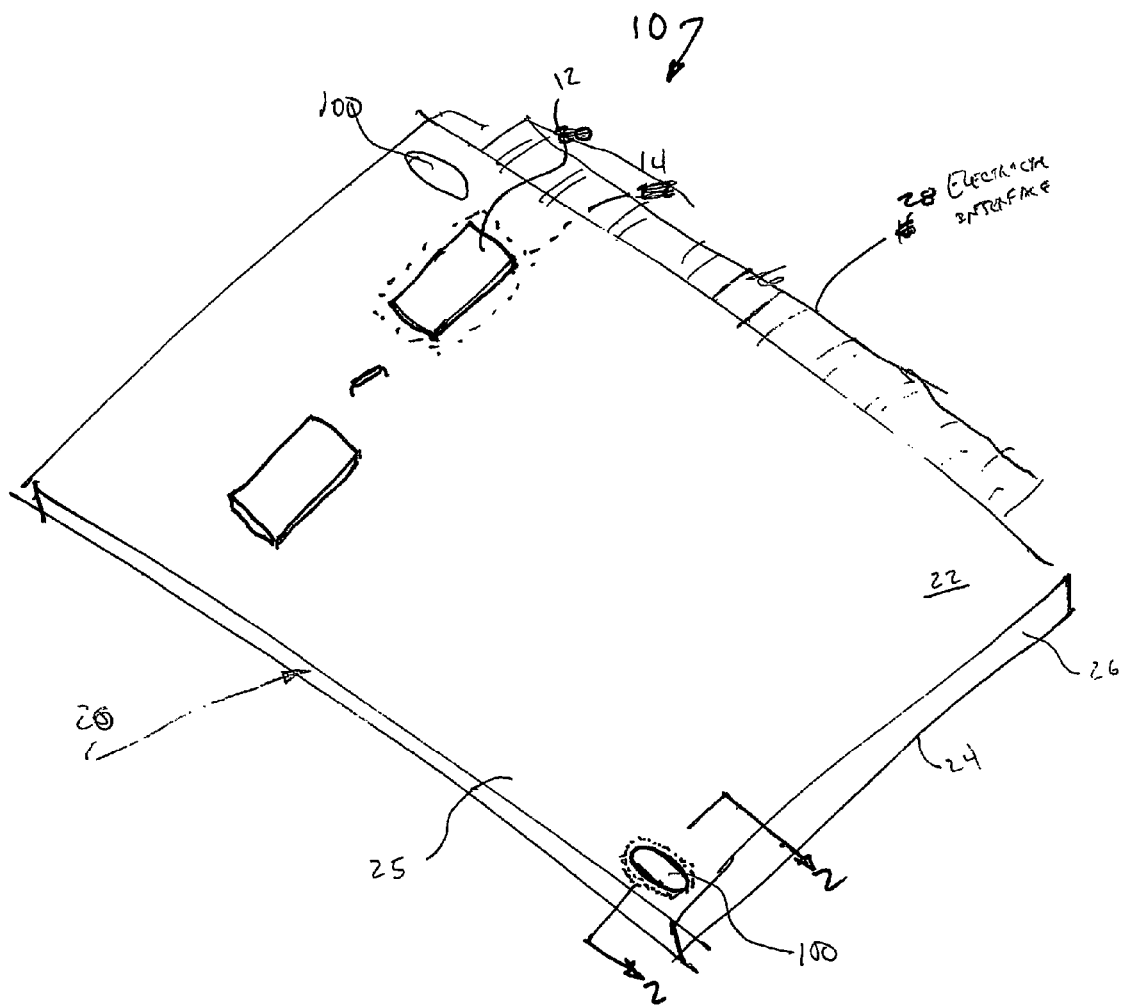
FIG. 1 is a schematic perspective view of a microelectronic component assembly in accordance with one embodiment.

FIG. 1 schematically illustrates a microelectronic component assembly 10 that generally includes a microelectronic substrate 20 that carries a number of microelectronic components 12. Each of the microelectronic components 12 may be mounted at a mounting site 14 (shown schematically in dashed lines) that is adapted to receive the particular microelectronic component 12 for mechanical and electrical connection to the microelectronic substrate 20. Any of a variety of known microelectronic components 12 may be attached to the microelectronic component substrate 30 in any manner known in the art.

The microelectronic component substrate 20 includes a body 25 that carries a thermally conductive member 100. The body 25 has a "front" surface 22 and a "back" surface 24 spaced apart from one another by a thickness T of the body 25. (Reference to "front" and "back" is solely for purposes of convenience and does not imply any particular orientation of the microelectronic component substrate 20.) A periphery 26 of the body 25 extends between the front and back surfaces 22 and 24. In the illustrated embodiment, the periphery 26 carries an electrical interface 28 to enable coupling of the microelectronic component assembly 10 to other microelectronic components (not shown), e.g., a bus of a computer that communicates with a series of other microelectronic component assemblies.

FIGS. 2-5 illustrate the microelectronic component substrate 20 of FIG. 1 in greater detail. As shown in these drawings, the body 25 of this particular microelectronic component substrate 20 comprises a plurality of separate body layers that together define the overall thickness T of the body 25. In particular, the body 25 of FIGS. 2-5 includes a "front" body layer 30, a "back" body layer 40, and an intermediate body layer 50 disposed between the front and back body layers 30 and 40. In this arrangement, an inner surface 32 of the front body layer 30 is juxtaposed with a front surface 52 of the intermediate body layer 50. Likewise, an inner surface 42 of the back body 40 is juxtaposed with a back surface 54 of the intermediate body layer 50.

At least one of the body members 30, 40, and 50 may carry an electrically conductive layer 55 to which some or all of the microelectronic components 12 (FIG. 1) are electrically coupled. As is known in the art, such an electrically conductive layer 55 typically comprises a metal layer that has been patterned to define an electrical circuit that interconnects the microelectronic components 12 to provide a functioning microelectronic component assembly 10. In the illustrated embodiment, the intermediate body layer 50 includes a first electrically conductive layer 55a on the front surface 52 and a second electrically conductive layer 55b on the back surface 54. In one embodiment, one of these electrically conductive layers 55 may function as a ground layer for the microelectronic component assembly 10.

Each of the body layers 30, 40, and 50 may comprise any of a variety of dielectric materials. For example, the body layers 30, 40, and 50 may comprise a relatively thin, flexible film to provide a flexible printed circuit. In other embodiments, the body layers 30, 40, and 50 may comprise a more rigid dielectric material, e.g., any material commonly employed in PCBs. In select embodiments, each of the layers 30, 40, and 50 may comprise a glass filament- and particulate-reinforced resins such as FR4, High TG FR4, or high performance RF materials. The material of body layers 30, 40, and 50 may be selected to achieve a particular electrical or thermal performance objective of the finished microelectronic component assembly 10. In the illustrated embodiment, each of the body layers 30, 40, and 50 are formed of the same material. In other embodiments, the layers 30, 40, and 50 may be different from one another.

As is known in the art, the body layers 30, 40, and 50 may be laminated together using an adhesive dr other cementitious material. In FIGS. 2-5, a first adhesive layer 60a attaches the front body layer 30 to the intermediate body layer 50 and a second adhesive layer 60b attaches the back body layer 40 to the intermediate body layer 50. A wide variety of suitable adhesives are known in the art. If the body layers 30, 40, and 50 comprise FR4, any of a variety of commercially available FR4 adhesive materials may be used. In the embodiment shown in FIG. 3, the adhesive layers 60a and 60b comprise a sheet that is pre-impregnated with a suitable adhesive resin.

The front body layer 30 includes a first opening 36 that extends therethrough, the intermediate body layer 50 includes a second opening 56 that extends through its thickness, and the back layer 40 includes a third opening 46 therethrough. The second opening 56 extends outwardly beyond a periphery of at least one of the first and third openings 36 and 46. In the illustrated embodiment, the first and third openings 36 and 46 are about the same size and the second opening 56 extends outwardly beyond the periphery of both of those openings. As a consequence, a transverse recess is formed between the front and back body layers 30 and 40.

This leaves a peripheral surface of the inner surface 32 juxtaposed with, but spaced from, a peripheral portion of the inner surface 42 of the back body layer 40.

The openings may be precisely machined using a CNC router or the like to create concentric openings to accommodate the thermally conductive members 100. The lamination adhesive layers 60 may be laser or die-cut to produce openings that match openings 36 and 46.

As noted above, the microelectronic substrate 20 includes one or more thermally conductive members or "slugs" 100, with two such thermally conductive members 100 being shown in the microelectronic component assembly 10 of FIG. 1. The slugs 100 may comprise an integrally formed and suitably shaped piece of metal or other material that is more thermally conductive than the body 25. A polymeric material can be used as the thermally conductive member 100, in many embodiments the thermally conductive member 100 is a thermally conductive metal, e.g., copper or aluminum. If the slug 100 is to be electrically coupled to the conductive layers 55, copper and aluminum would meet that objective, as well.

The slug 100 includes a front thickness adjacent its front surface 102, a back thickness adjacent its back surface 104 and an intermediate thickness disposed between the front and back thicknesses. The intermediate thickness has a lateral dimension that is greater than the corresponding dimension of one or both of the front and back thicknesses. As a consequence, the slug 100 includes a transversely extending flange 110 that extends transversely outwardly into the recess between the front and back body members 30 and 40 of the body 25. The flange may define a shoulder that can be juxtaposed with and bonded to an attachment surface of each of the front and back body members 30 and 40 by means of a suitable adhesive 70. In the illustrated embodiment, the first attachment adhesive 70a may attach the flange 110 to the inner surface 32 of the front body member 30 and a second attachment adhesive 70b may attach the flange 110 to the inner surface 42 of the back body layer 40. These attachment adhesives 70 may be screen-printed or pre-formed. The adhesive may be thermally conductive and/or electrically conductive. If the adhesive 70 is electrically conductive, it can couple the slug to conductive layers 55 of the body 25.

By carefully specifying the thickness of the slug 100 to match the thickness of the body, good planarity with slight prominence of the slug 100 can be achieved. In some embodiments, slight prominence of the slug 100 may be desirable to provide good contact with a microelectronic component 12 while not over-stressing the component leads. In one exemplary design, the thickness of the coin can be slightly thicker than the thickness T of the body 25.

In an embodiment where no electrical ground properties are required between the slug and the ground plane of the PCB, the flange 110 can be eliminated completely. Without a flange 110, assembly can be even easier and less expensive.

Figure 5:
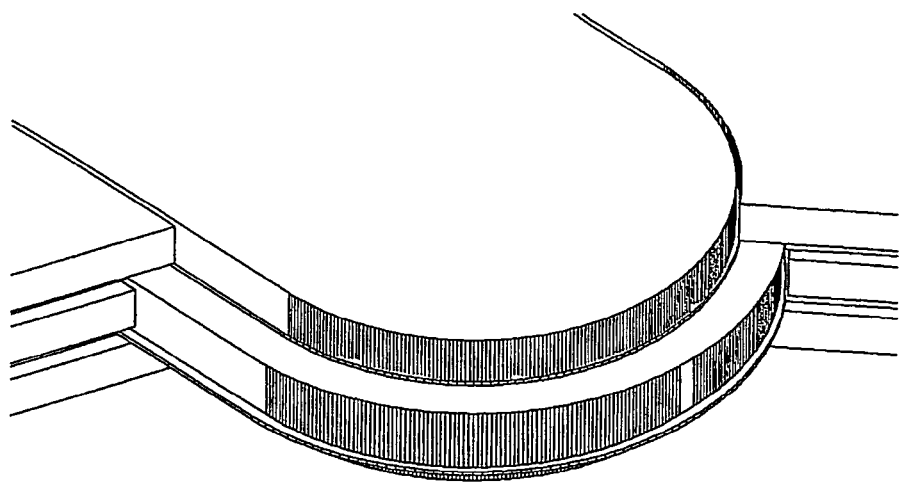
FIG. 5 is a schematic 3-D laminated close-up cut-away view of a portion of the microelectronic component substrate of FIG. 4.
Figure 6:
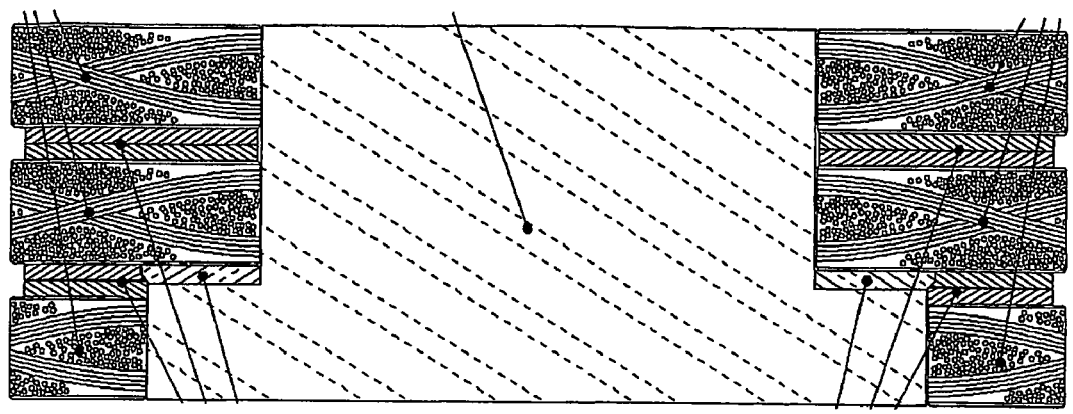
FIG. 6 is a schematic cross-sectional view of a portion of a microelectronic component substrate in accordance with another embodiment.
Figure 7:
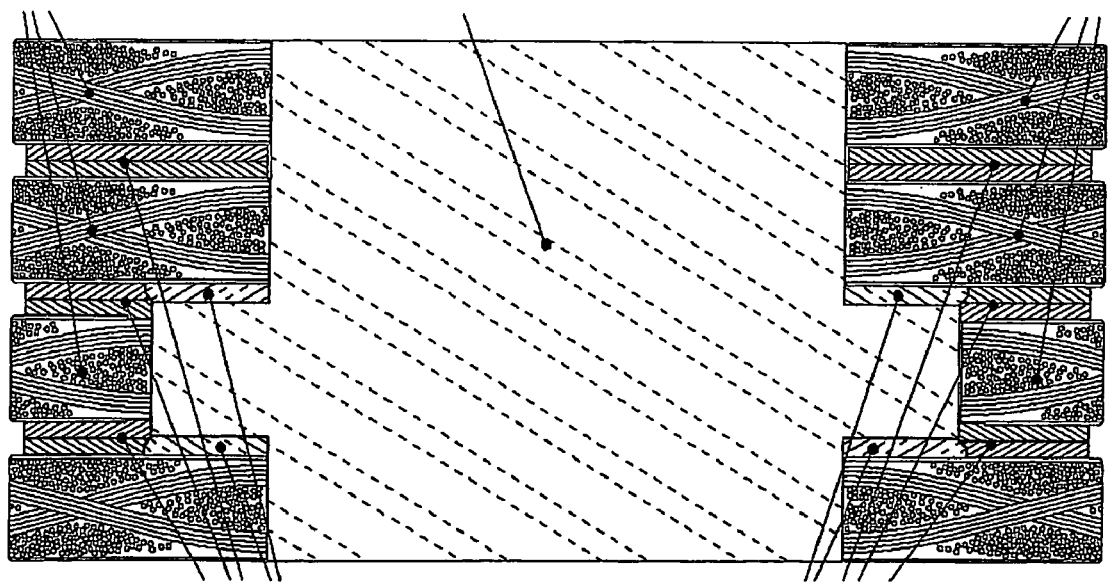
FIG. 7 is a schematic cross-sectional view of a portion of a microelectronic component substrate in accordance with yet another embodiment.

FIGS. 6 and 7 illustrate alternative designs with differently shaped slugs 100a and 100b. In FIG. 6, the flange 110a is adjacent an end of the slug 100 but is recessed inside the back body layer. The substrate of FIG. 7 includes more body layers, but the design and construction may otherwise parallel that discussed above. The flange may be located on either side (FIG. 6) of the slug 100, in the center (FIG. 2-5) or off-center (FIG. 7).

FIG. 5 illustrates an alternative cross-sectional design that can be built in accordance with another embodiment of the invention. This process of laminating the coin/slug (1) directly in the PCB does not require and is not limited to the center located "flanged" detail. Other coin/slug designs including those illustrated and others which are not specifically depicted, may be suitable for use, too. FIG. 5 shows a flange located on one side of the coin/slug (1) and one layer of conductive adhesive material (4) providing ground connection to only one layer in the multilayer PCB. The rest of the PCB may comprise a standard design copper clad core material (2), and lamination adhesive material (3).

C. Methods of Manufacture

Figure 3:
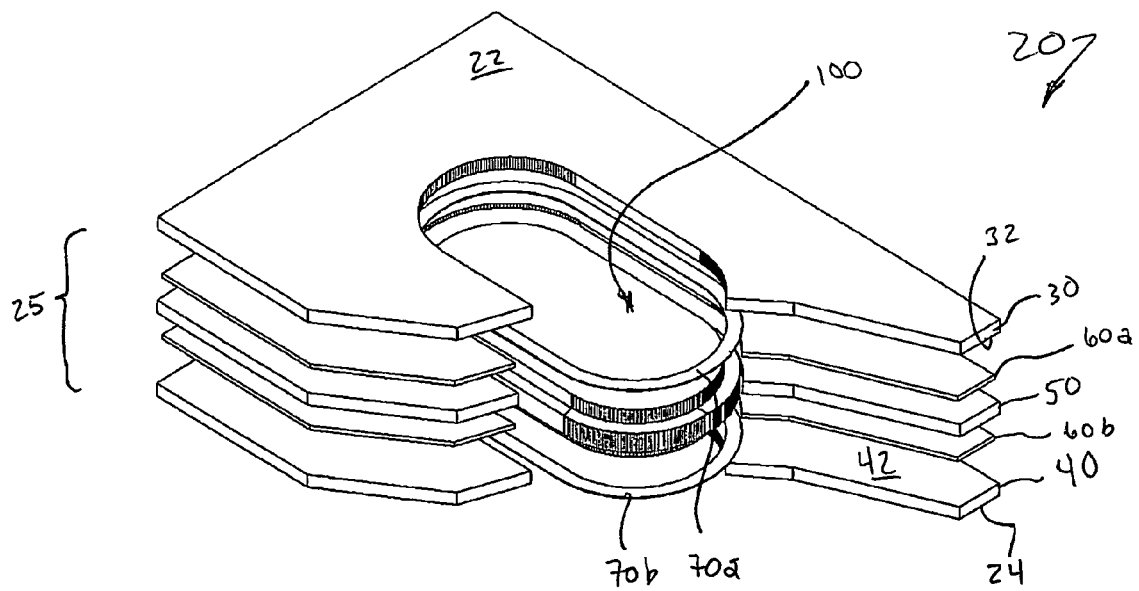
FIG. 3 is a schematic 3-D exploded cut-away view of a portion of the microelectronic component substrate of FIGS. 1 and 2.
Figure 4:
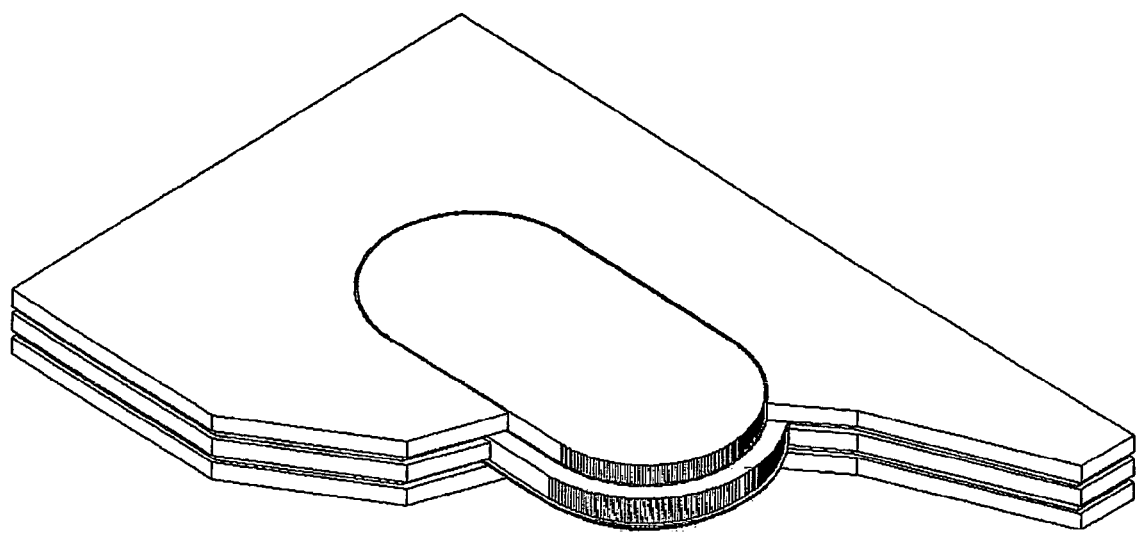
FIG. 4 is a schematic 3-D laminated cut-away view of the portion of the microelectronic component substrate shown in FIG. 3.

The exploded, 3-D cut-away view of FIG. 3 schematically illustrates the relationship between the various components of the microelectronic component substrate 20 during manufacture. This view also suggests the sequence of assembly steps that are required to assemble the substrate 20.

Figure 2:
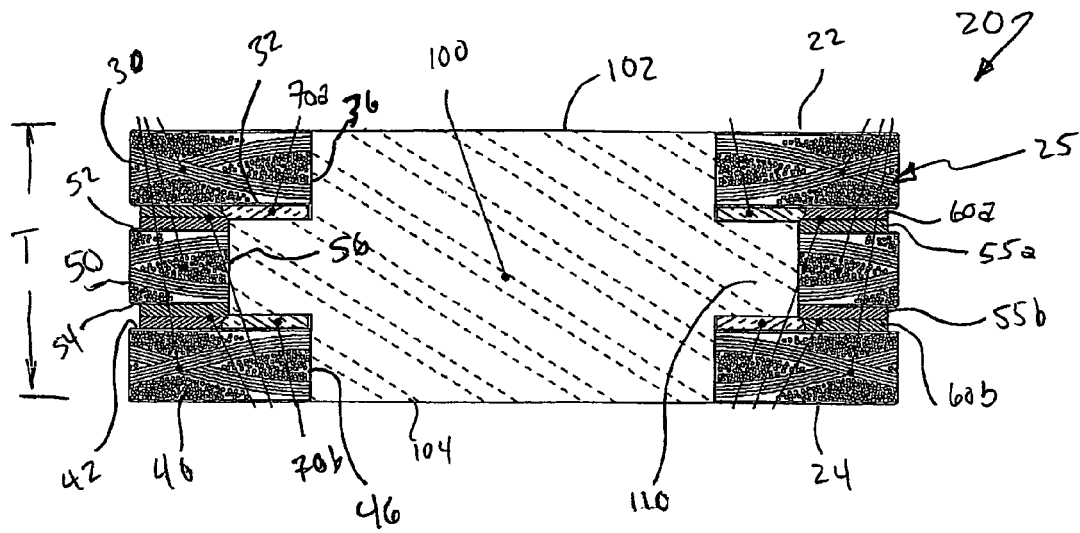
FIG. 2 is a schematic cross-sectional view of the microelectronic component substrate of FIG. 1, taken along line 2-2.

The components of the substrate 20 may be assembled, referred to as a "collation lay-up," of the specific microelectronic component assembly of FIG. 2 may follow the following sequence:

1. Back layer 40
2. Conductive adhesive material 70b
3. Slug 100
4. Lamination adhesive material 60b
5. Intermediate body layer 50
6. Lamination adhesive material 60a
7. Conductive adhesive material 70a
8. Front layer 30

This arrangement facilitates easy assembly of the microelectronic component substrate 20 and securely integrates the slug 100 in the structure for better mechanical and thermal connection.

Some advantages of select embodiments include:

a. By manufacturing PCB dielectric materials with concentric features allowing the coin/slug to be sized and toleranced to nest in the openings;
b. By manufacturing PCB compatible adhesive materials that align with the laminate features and coin/slug, which can facilitate assembly in conventional lamination presses; and/or
c. Selecting any of various cross-section coin/slug designs, e.g., designs having offset flanges or centerline flanges aligning with one or more layers in the PCB construction. Such a flange could be circumferential or limited to specific locations around the coin creating isolated protrusions.

The above-detailed embodiments of the invention are not intended to be exhaustive or to limit the invention to the precise form disclosed above. Specific embodiments of, and examples for, the invention are described above for illustrative purposes, but those skilled in the relevant art will recognize that various equivalent modifications are possible within the scope of the invention. For example, whereas steps are presented in a given order, alternative embodiments may perform steps in a different order. The various embodiments described herein can be combined to provide further embodiments.

Unless the context clearly requires otherwise, the words "comprise," "comprising," and the like are to be construed in an inclusive sense as opposed to an exclusive or exhaustive sense, i.e., in a sense of "including, but not limited to." In general, the terms used in this disclosure should not be construed to limit the invention to the specific embodiments described above unless the above-detailed description explicitly defines such terms. While certain aspects of the invention are presented above in certain exemplary embodiments, the inventors contemplate various aspects of the invention in any number of embodiments. The inventors reserve the right to add additional claims after filing the application to pursue additional claim forms for aspects of the invention not currently claimed.

What is claimed is:

1. A multi-layer printed circuit board comprising:
   a first body layer having a first opening therethrough;
   a second body layer juxtaposed with the first body layer and having a second opening therethrough, the second opening extending outwardly beyond a periphery of the first opening to define an attachment surface on the first body layer;
   an electrically conductive layer disposed between the first and second body layers;
   a thermally conductive slug received in and extending between the first and second openings and thermally coupled to the electrically conductive layer, the slug including a transversely extending flange that is attached to the attachment surface; and
   a third body layer juxtaposed with the second body layer and spaced from the first body layer, the third body layer having a third opening therethrough that is smaller than the second opening, wherein the flange of the slug is received between the first and third body layers.

2. The printed circuit board of claim 1 wherein the flange of the slug is attached to the attachment surface by a thermally conductive cementitious material.

3. The printed circuit board of claim 1 wherein the slug is electrically coupled to the electrically conductive layer.

4. The printed circuit board of claim 1 wherein the flange of the slug is attached to the attachment surface by an electrically conductive cementitious material that also electrically couples the slug to the electrically conductive layer.

* * * * *